United States Patent
Kuo et al.

(10) Patent No.: US 10,504,962 B2
(45) Date of Patent: Dec. 10, 2019

(54) UNIPOLAR CURRENT SWITCHING IN PERPENDICULAR MAGNETIC TUNNEL JUNCTION (PMTJ) DEVICES THROUGH REDUCED BIPOLAR COERCIVITY

(71) Applicant: Intel Corporation, Santa Clara, CA (US)

(72) Inventors: Charles C. Kuo, Union City, CA (US); Mark L. Doczy, Beaverton, OR (US); Kaan Oguz, Beaverton, OR (US); Kevin P. O'Brien, Portland, OR (US); Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/069,122

(22) PCT Filed: Mar. 28, 2016

(86) PCT No.: PCT/US2016/024573
§ 371 (c)(1),
(2) Date: Jul. 10, 2018

(87) PCT Pub. No.: WO2017/171718
PCT Pub. Date: Oct. 5, 2017

(65) Prior Publication Data
US 2019/0006417 A1   Jan. 3, 2019

(51) Int. Cl.
*G11C 11/16*  (2006.01)
*H01L 27/22*  (2006.01)
(Continued)

(52) U.S. Cl.
CPC .......... *H01L 27/228* (2013.01); *G11C 11/161* (2013.01); *G11C 11/1673* (2013.01);
(Continued)

(58) Field of Classification Search
CPC . G11C 11/161; G11C 11/1673; H01L 27/224; H01L 27/228; H01L 43/02; H01L 43/08; H01L 43/10
(Continued)

(56) References Cited

U.S. PATENT DOCUMENTS 6,130,835 A * 10/2000 Scheuerlein ............ G11C 11/15
365/158
7,961,534 B2   6/2011 Kang et al.
(Continued)

FOREIGN PATENT DOCUMENTS

WO   WO-2014079747   5/2014

OTHER PUBLICATIONS

International Preliminary Report on Patentability for International Patent Application No. PCT/US2016/024573, dated Oct. 11, 2018, 9 pages.
(Continued)

*Primary Examiner* — Tan T. Nguyen
(74) *Attorney, Agent, or Firm* — Schwabe, Williamson & Wyatt, P.C.

(57) ABSTRACT

Approaches and structures for unipolar current switching in perpendicular magnetic tunnel junction (pMTJ) devices through reduced bipolar coercivity are described. In an example, a memory array includes a plurality of bitlines and a plurality of select lines. The memory array also includes a plurality of memory elements located among and coupled to the plurality of bitlines and the plurality of select lines. Each of the plurality of memory elements includes a unipolar switching magnetic tunnel junction (MTJ) device and a select device.

11 Claims, 9 Drawing Sheets

(51) Int. Cl.
*H01L 43/08* (2006.01)
*H01L 43/02* (2006.01)
*H01L 43/10* (2006.01)

(52) U.S. Cl.
CPC ............ *H01L 27/224* (2013.01); *H01L 43/08* (2013.01); *H01L 43/02* (2013.01); *H01L 43/10* (2013.01)

(58) Field of Classification Search
USPC ........................................ 365/157, 158, 171
See application file for complete search history.

(56) References Cited

U.S. PATENT DOCUMENTS

| 9,177,633 | B2 | 11/2015 | Roy et al. | |
|---|---|---|---|---|
| 2008/0310214 | A1* | 12/2008 | Wang | G11C 11/1659 365/158 |
| 2010/0103727 | A1* | 4/2010 | Lou | H01L 27/224 365/171 |
| 2011/0164447 | A1* | 7/2011 | Arita | G11C 13/0007 365/148 |
| 2013/0343117 | A1 | 12/2013 | Lua et al. | |
| 2014/0160830 | A1* | 6/2014 | Chung | G11C 13/0004 365/96 |
| 2014/0185361 | A1* | 7/2014 | Oh | G11C 13/004 365/148 |
| 2014/0247653 | A1* | 9/2014 | Wang | H01L 43/08 365/158 |
| 2015/0131370 | A1* | 5/2015 | Zhou | G11C 11/1675 365/158 |
| 2016/0020250 | A1 | 1/2016 | Li et al. | |
| 2016/0035401 | A1* | 2/2016 | Kent | H01L 43/08 365/158 |
| 2016/0180908 | A1* | 6/2016 | Zhou | G11C 11/1673 365/156 |
| 2018/0212141 | A1* | 7/2018 | Sharma | G11C 11/1659 |

OTHER PUBLICATIONS

International Search Report and Written Opinion for International Patent Application No. PCT/US2016/024573 dated Dec. 22, 2016, 12 pgs.

\* cited by examiner

UNIPOLAR CURRENT SWITCHING IN PERPENDICULAR MAGNETIC TUNNEL JUNCTION (PMTJ) DEVICES THROUGH REDUCED BIPOLAR COERCIVITY

CROSS-REFERENCE TO RELATED APPLICATION

This patent application is a U.S. National Phase Application under 35 U.S.C. § 371 of International Application No. PCT/US2016/024573, filed Mar. 28, 2016, entitled "UNIPOLAR CURRENT SWITCHING IN PERPENDICULAR MAGNETIC TUNNEL JUNCTION (PMTJ) DEVICES THROUGH REDUCED BIPOLAR COERCIVITY," which designates the United States of America, the entire disclosure of which is hereby incorporated by reference in its entirety and for all purposes.

TECHNICAL FIELD

Embodiments of the invention are in the field of integrated circuit fabrication and, in particular, approaches and structures for unipolar current switching in perpendicular magnetic tunnel junction (pMTJ) devices through reduced bipolar coercivity.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Non-volatile embedded memory, e.g., on-chip embedded memory with non-volatility can enable energy and computational efficiency. However, there may be density limitations for traditional spin torque transfer magnetoresistive random access memory (STT-MRAM) integration to accommodate large write switching current and select transistor requirements. Specifically, traditional STT-MRAM has a cell size limitation due to the drive transistor requirement to provide sufficient spin current. Furthermore, such memory is associated with large write current (>100 µA) and voltage (>0.7 V) requirements of conventional magnetic tunnel junction (MTJ) based devices.

As such, significant improvements are still needed in the area of non-volatile memory arrays based on MTJs and, in particular, the switching of such devices.

DESCRIPTION OF THE EMBODIMENTS

Approaches and structures for unipolar current switching in perpendicular magnetic tunnel junction (pMTJ) devices through reduced bipolar coercivity are described. In the following description, numerous specific details are set forth, such as specific magnetic tunnel junction (MTJ) layer regimes, in order to provide a thorough understanding of embodiments of the present invention. It will be apparent to one skilled in the art that embodiments of the present invention may be practiced without these specific details. In other instances, well-known features, such as operations associated with embedded memory, are not described in detail in order to not unnecessarily obscure embodiments of the present invention. Furthermore, it is to be understood that the various embodiments shown in the Figures are illustrative representations and are not necessarily drawn to scale.

One or embodiments of the present invention are directed to unipolar current switching in pMTJs. In one such embodiment, a pMTJ device is operated as a unipolar switch by using reduced bipolar coercivity. Embodiments may pertain to approaches for enabling unipolar switching of MTJ-based devices.

To provide context, it is to be appreciated that traditional DRAM memory is facing severe scaling issues and, so, other types of memory devices are being actively explored in the electronics industry. One future contender is STT-MRAM devices. Embodiments described herein include approaches for operating an STT-MRAM bit cell as a unipolar switch.

In accordance with an embodiment of the present invention, a transistor is enabled to switch an MTJ from the drain side alone. By switching the MTJ from the drain side only, current degradation through source degeneration can be avoided. In an embodiment, an MTJ is used with a current-driven unipolar selector (e.g., such as a diode selector) to achieve a 4F2 cell size in a cross-point array, where 4F2 refers to a physical array cell area of 2F×2F, where F=minimum half-pitch of a metal line (typically from back-end); this is the smallest physical area that can be realized. One or more embodiments involves implementation of a bi-polar reduction in MTJ coercivity to enable unipolar current switching. In a particular embodiment, the unipolar switch is a thin-MgO MTJ, e.g., approximately one nanometer in physical thickness. It can be done with MTJ on drain side, enabling higher currents by avoiding source degeneration.

Figure 1:
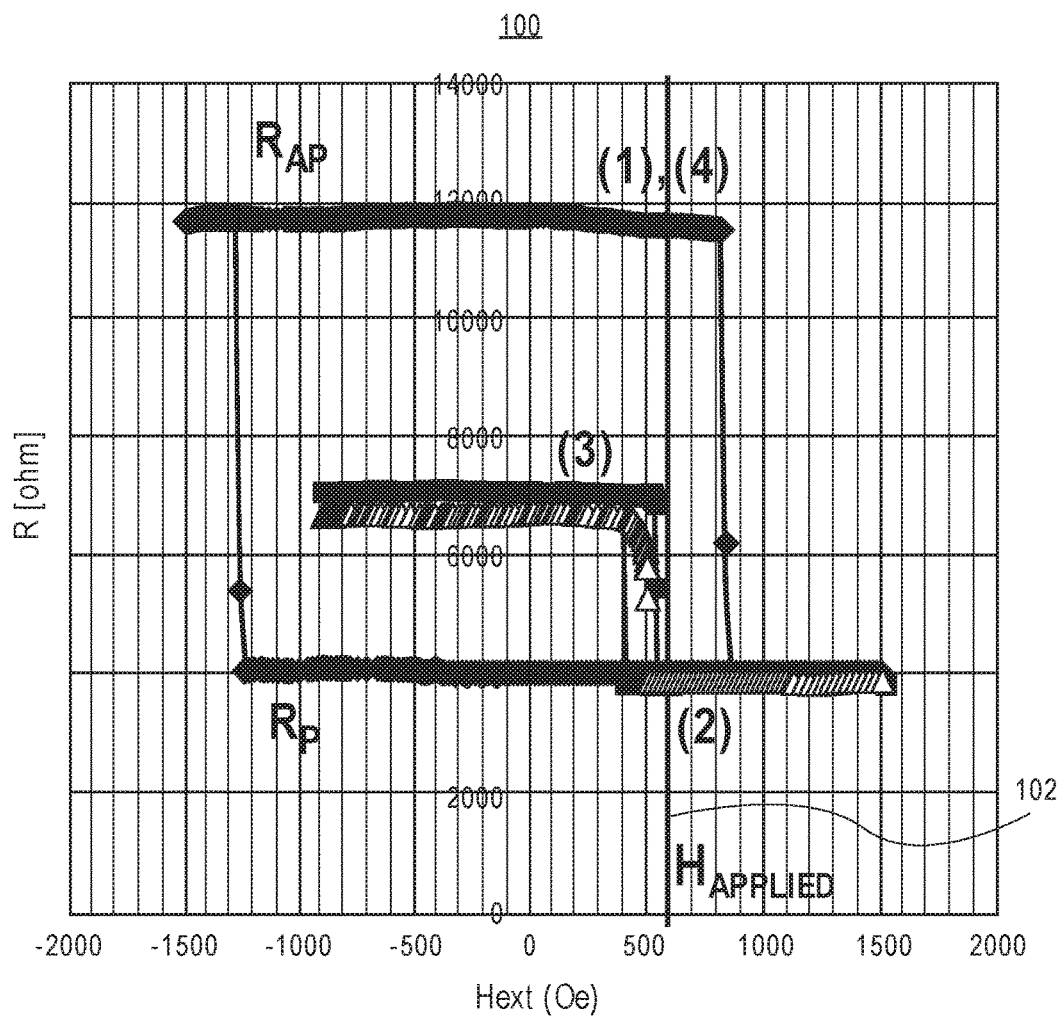
FIG. 1 is a plot of resistance, R (in Ohms), as a function of applied external magnetic field, Hext (in Oersteds), for an MTJ device, in accordance with an embodiment of the present invention.

FIG. 1 is a plot 100 of resistance, R (in Ohms), as a function of applied external magnetic field, Hext (in Oersteds), for an MTJ device, in accordance with an embodiment of the present invention. In plot 100, $R_{AP}$ is resistance of an anti-parallel state, $R_P$ is resistance of a parallel state, and $H_{Applied}$ is the applied magnetic field. Referring to plot 100, a bit is biased near line 102 when Hext=0. The biasing may be achieved through engineering stray fields from a fixed layer or, for a magnetic field offset (Hoffset) of approximately 0, by enabling a large enough reduction of switching magnetic fields at positive/negative polarities. In the particular illustrated in plot 100, Hext is equal to $H_{Applied}$ to bias the bit magnetically. In the case that starting resistance is an anti-parallel state (AP-state), applying a modest MTJ voltage causes the resistance to drop from anti-parallel (AP) to parallel (P). In in embodiment, for a larger MTJ voltage, the resistance can switch from parallel (P) to anti-parallel (AP).

Figure 2:
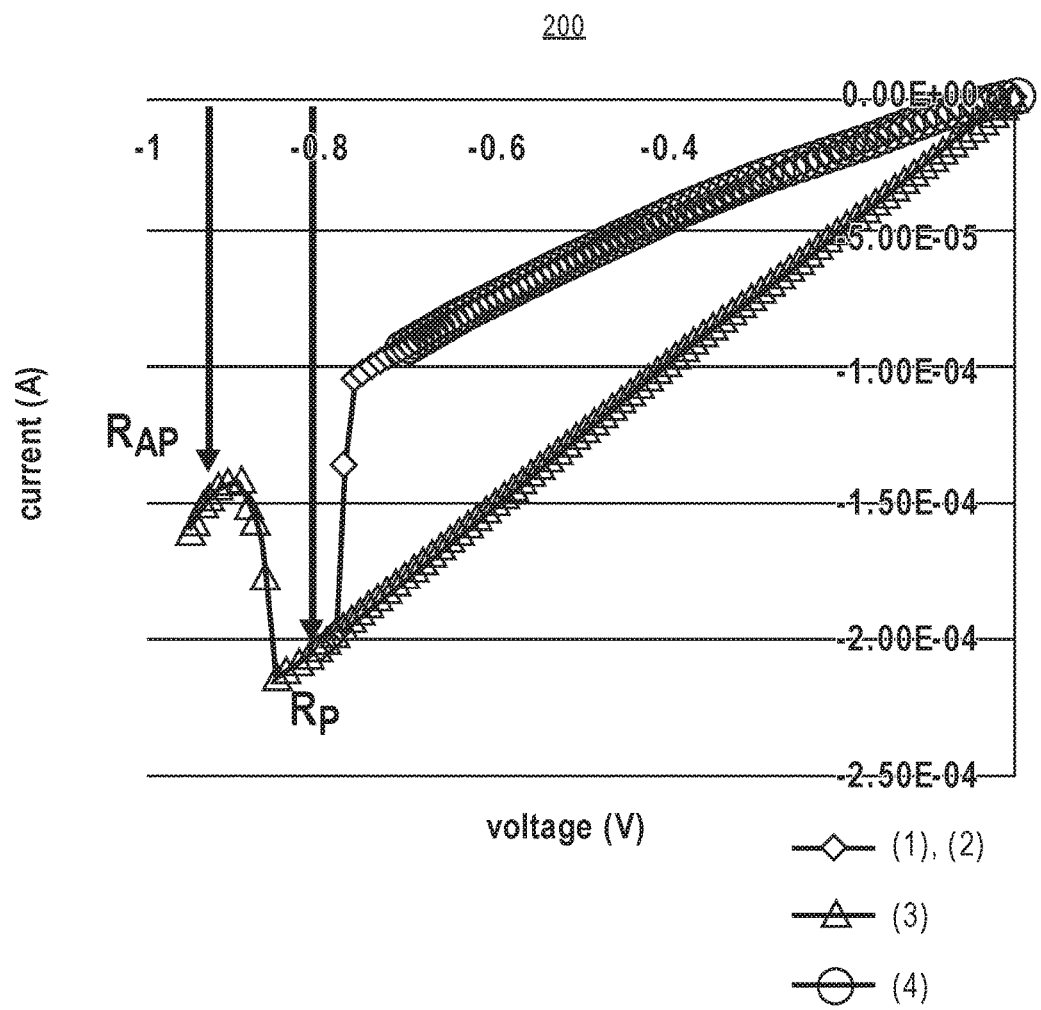
FIG. 2 is a plot of current (in Amps) as a function of voltage (in Volts) for an MTJ device, in accordance with an embodiment of the present invention.

FIG. 2 is a plot 200 of current (in Amps) as a function of voltage (in Volts) for an MTJ device, in accordance with an embodiment of the present invention. Referring to plot 200, the coercivity recovers upon returning the voltage to zero. In an embodiment, a larger stability for standby or read states is achieved. Referring collectively to plots 100 and 200, four key operations are demonstrated: (1) a bit based on an MTJ starts in an anti-parallel (AP-state). In (2), the state is moved in to a parallel state (P-state). In (3), the state is moved in to an anti-parallel (AP-state). Finally, in (4), coercivity is recovered for stand-by or read.

Figure 3:
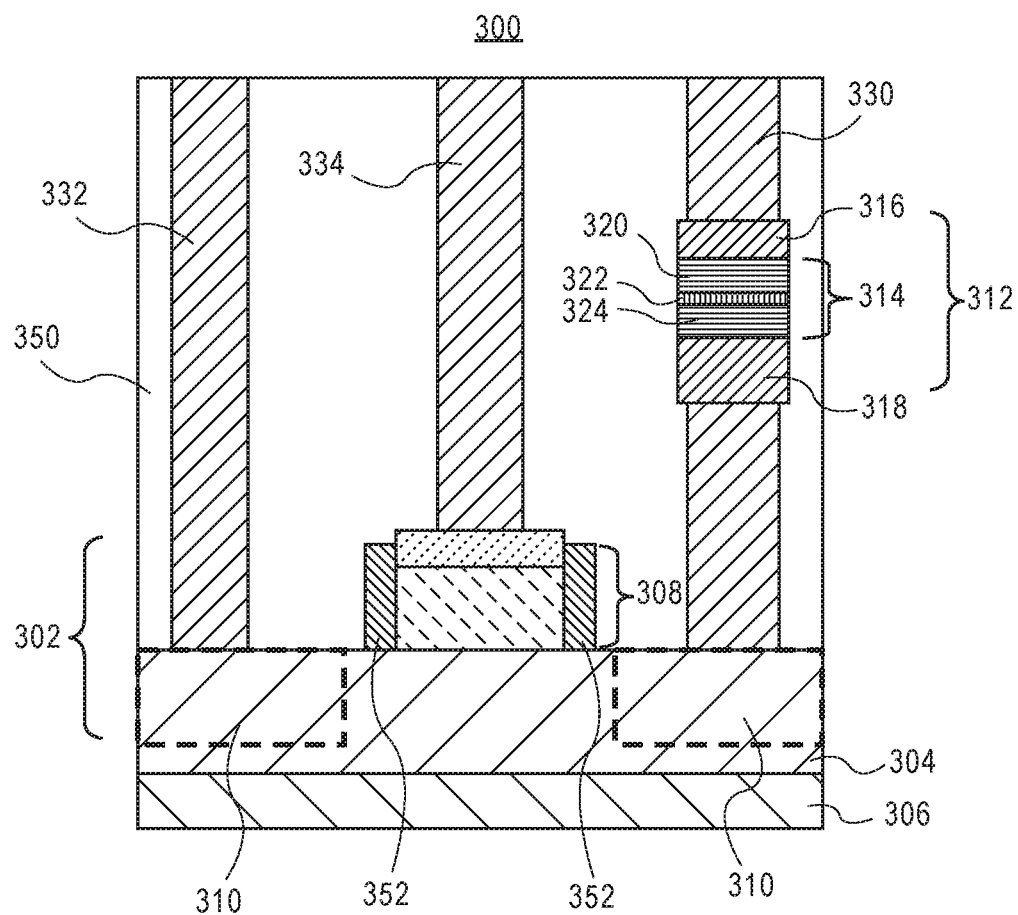
FIG. 3 illustrates a cross-sectional view of an MTJ coupled to only a drain side of a transistor selector, in accordance with an embodiment of the present invention.

FIG. 3 illustrates a cross-sectional view of an MTJ coupled to only a drain side of a transistor selector, in accordance with an embodiment of the present invention. Referring to FIG. 3, a memory structure 300 includes a transistor 302 disposed in or above an active region 304 of a semiconductor substrate 306. The transistor 302 includes a gate electrode 308 with source/drain regions 310 on either side of the gate electrode 308, and in active region 304 of substrate 306. In an embodiment, the source/drain region 310 on the left-hand side of FIG. 3 is a source region, and the source/drain region 310 on the right-hand side of FIG. 3 is a drain region. An MTJ element 312 is coupled to the drain region of the transistor 302, but not to the source region of the transistor 302. The arrangement enables driving of the MTJ element 312 by the drain side only. The MTJ element 312 and portions of the transistor 302 may be included in an inter-layer dielectric (ILD) layer 350, as is depicted in FIG. 3.

The MTJ element 312 includes an MTJ stack 314, a top electrode 316, and a bottom electrode 318. The MTJ stack 314 includes a free magnetic layer 320, a tunneling layer 322, such as a tunneling dielectric layer, and a fixed magnetic layer 324. Thus, in an embodiment, the free magnetic layer 320 is distal from the drain region 310 of the transistor 302, and the fixed magnetic layer 324 is proximate to the drain region 310 of the transistor 302, as taken with the free and fixed layers relative to one another. However, although the MTJ stack depicted in FIG. 3 includes the free magnetic layer above the fixed magnetic layer, it is to be appreciated that the opposite arrangement may also be suitable, with the fixed magnetic layer above the free magnetic layer. It is also to be appreciated that although the MTJ stacks can actually include numerous layers of very thin films, for the sake of simplicity the MTJ stack 314 is divided into four portions in FIG. 3: bottom MTJ films 318 and 324, tunnel barrier material 322, top MTJ films 320, and MTJ top electrode 316.

Referring again to FIG. 3, the MTJ element 312 is, in an embodiment, included as an interrupting feature along a conductive drain contact 330. In one such embodiment, corresponding gate contact 334 and source contact 332 are not coupled to, or interrupted by the MTJ element 312, as is depicted in FIG. 3. It is to be appreciated that although the MTJ element 312 is shown generically along the drain contact 330 without a lateral reference, the actual layer in which the MTJ element 312 is included may be viewed as an interconnect layer (e.g., M1, M2, M4, etc.) of corresponding to a logic region in another area of the substrate 306. It is also to be appreciated that additional interconnect layer(s) may be formed on top of the structure 300 shown in FIG. 3, e.g., using standard dual damascene process techniques that are well-known in the art.

Figure 4:
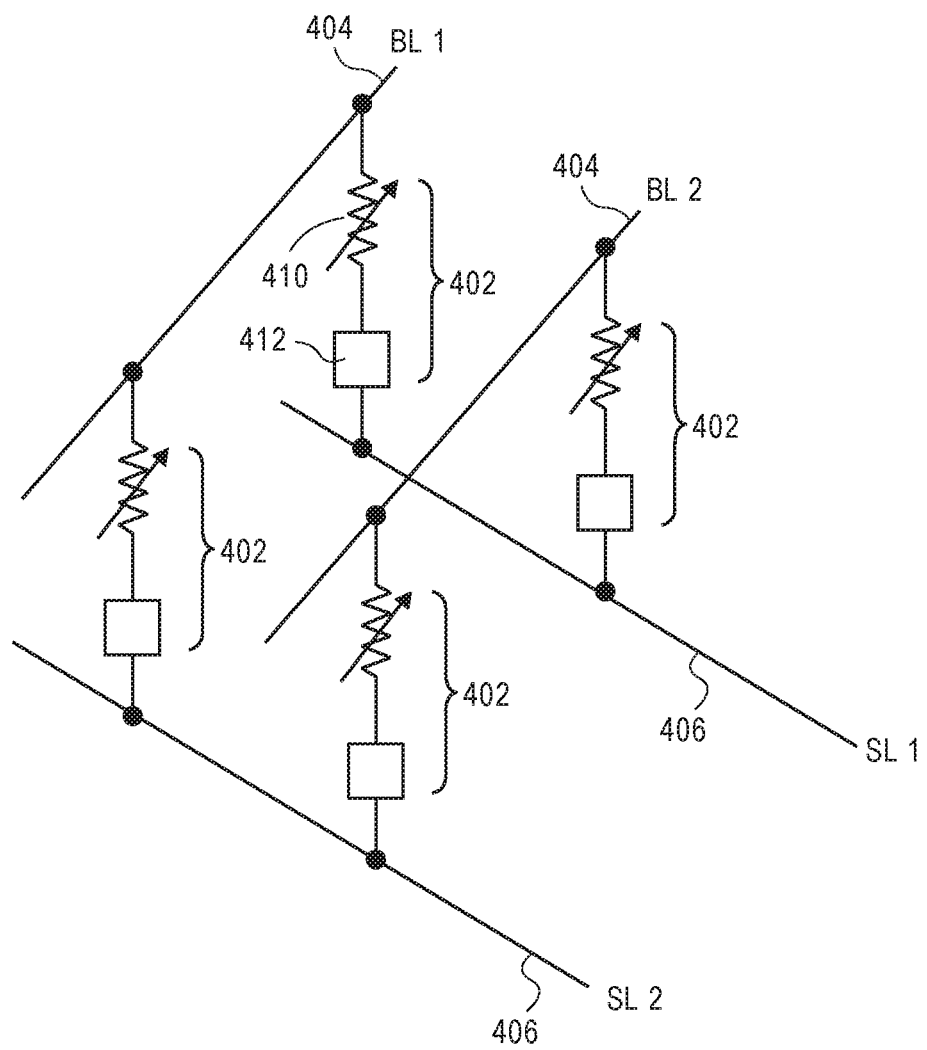
FIG. 4 illustrates a schematic of a memory array including unipolar switching MTJs, in accordance with an embodiment of the present invention.

FIG. 4 illustrates a schematic of a memory array 400 including unipolar switching MTJs, in accordance with an embodiment of the present invention. Referring to FIG. 400, a plurality of memory elements 402 are located among and coupled to a plurality of bitlines 404 (e.g., bitlines BL1 and BL2) and a plurality of select lines 406 (e.g., select lines SL1 and SL2). Each of the memory elements 402 includes a variable resistor 410, such as a unipolar switching MTJ device. Each of the memory elements 402 also includes a select device 412. In one embodiment, the select device 412 is a transistor and, in a particular embodiment, only a drain region and not a source region of the transistor is coupled to the variable resistor 410. In another embodiment, the select device 412 is a diode, such as a unipolar PN junction diode. In an embodiment, each of the unipolar switching MTJ devices is a unipolar switching perpendicular MTJ (pMTJ) device.

Figure 5:
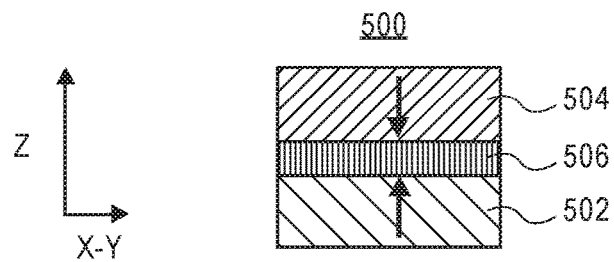
FIG. 5 illustrates a memory element including two magnetic layers, in accordance with an embodiment of the present invention.

In order to provide further understanding of a unipolar switching MTJ device, FIG. 5 illustrates a memory element 500 including two magnetic layers, in accordance with an embodiment of the present invention. Referring to FIG. 5, the memory element 500 includes a fixed magnetic layer 502 and a free magnetic layer 504. A tunnel dielectric layer 506 is included between the fixed magnetic layer 502 and the free magnetic layer 504. Spin states are indicated by the arrows in FIG. 5, where an anti-parallel arrangement is shown since the arrows are non-parallel or opposing along the z-direction in this case. In an embodiment, the MTJ device 500 is a perpendicular device since the spins are aligned along the z-axis shown (e.g., normal to an underlying substrate), as opposed to along the x-y axis shown.

There are several ways in which the free magnetic layer 504 will flip for a given magnet strength. In a first approach, electron current flows from the fixed magnetic layer 502 to the free magnetic layer 504, e.g., by applying a positive bias on the fixed magnetic layer 502. In a second approach, an external field is applied to flip the state of the free magnetic layer 504. In a third approach, a large electron current is flowed from the free magnetic layer 504 to the fixed magnetic layer 502, where reflected electrons are responsible for flipping the state of the free magnetic layer 504. It is to be appreciated that reversal of electron current direction enables magnetization to flip again.

Figure 6:
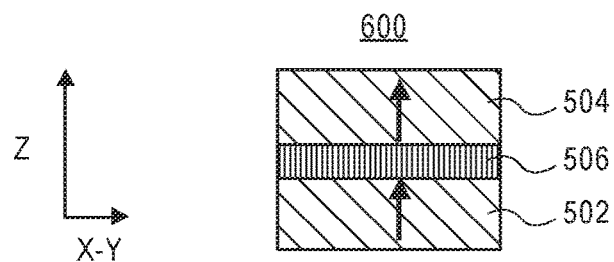
FIG. 6 illustrates an applied voltage arrangement for flipping the state of a free magnetic layer, in accordance with an embodiment of the present invention.

FIG. 6 illustrates an applied voltage arrangement for flipping the state of a free magnetic layer, in accordance with an embodiment of the present invention. Referring to FIG. 6, a memory element 600 (switched state of memory element 500 of FIG. 5) is shown with a negative voltage applied to the free magnetic layer 504 and a positive voltage applied to the fixed magnetic layer 502. Spin states are indicated by the arrows in FIG. 6, where a parallel arrangement is shown since the arrows are parallel along the z-direction in this case. In this arrangement, the second and third approaches described above are used to flip the state of the free magnetic layer 504: an external field is applied to flip the state of the free magnetic layer 504, and a large electron current is flowed from the free magnetic layer 504 to the fixed magnetic layer 502, where reflected electrons are responsible for flipping the state of the free magnetic layer 504.

Figure 7:
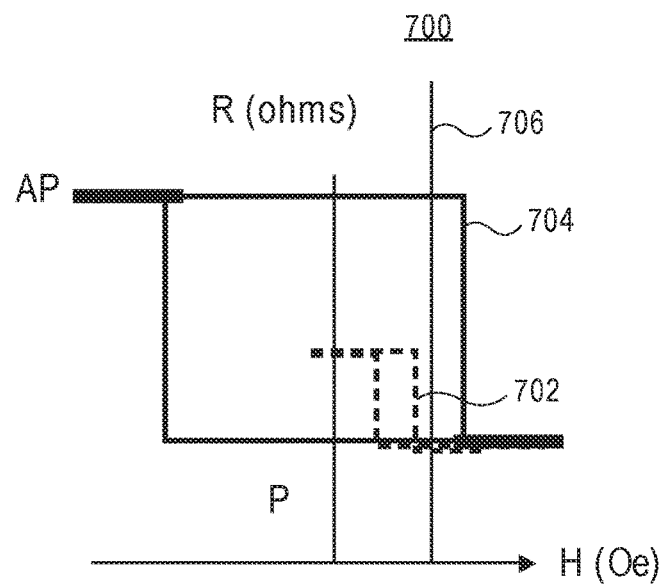
FIG. 7 is a schematic including different resistance-field (R-H) plots for different bias voltages, in accordance with an embodiment of the present invention.

FIG. 7 is a schematic 700 including different resistance-field (R-H) plots for different bias voltages, in accordance with an embodiment of the present invention. Referring to the R-H plots of FIG. 700, R-H curve 702 results from the application of a large negative bias. By contrast, R-H curve 704 results from the application of a small negative bias. In an embodiment, applying a negative bias on the fixed magnetic layer 502 changes the RH characteristic of the device. The resistance of the anti-parallel (AP) state drops, and the magnitude of the field that causes an AP to P state change is reduced. The direction of the field that changes the state from P to AP, however, reverses and the magnitude also drops. In an embodiment, a negative bias on a free magnetic layer 504 leads to an external field applied with the magnitude reflected by line 706, and the free magnetic layer 504 reverts to the AP state.

Figure 8:
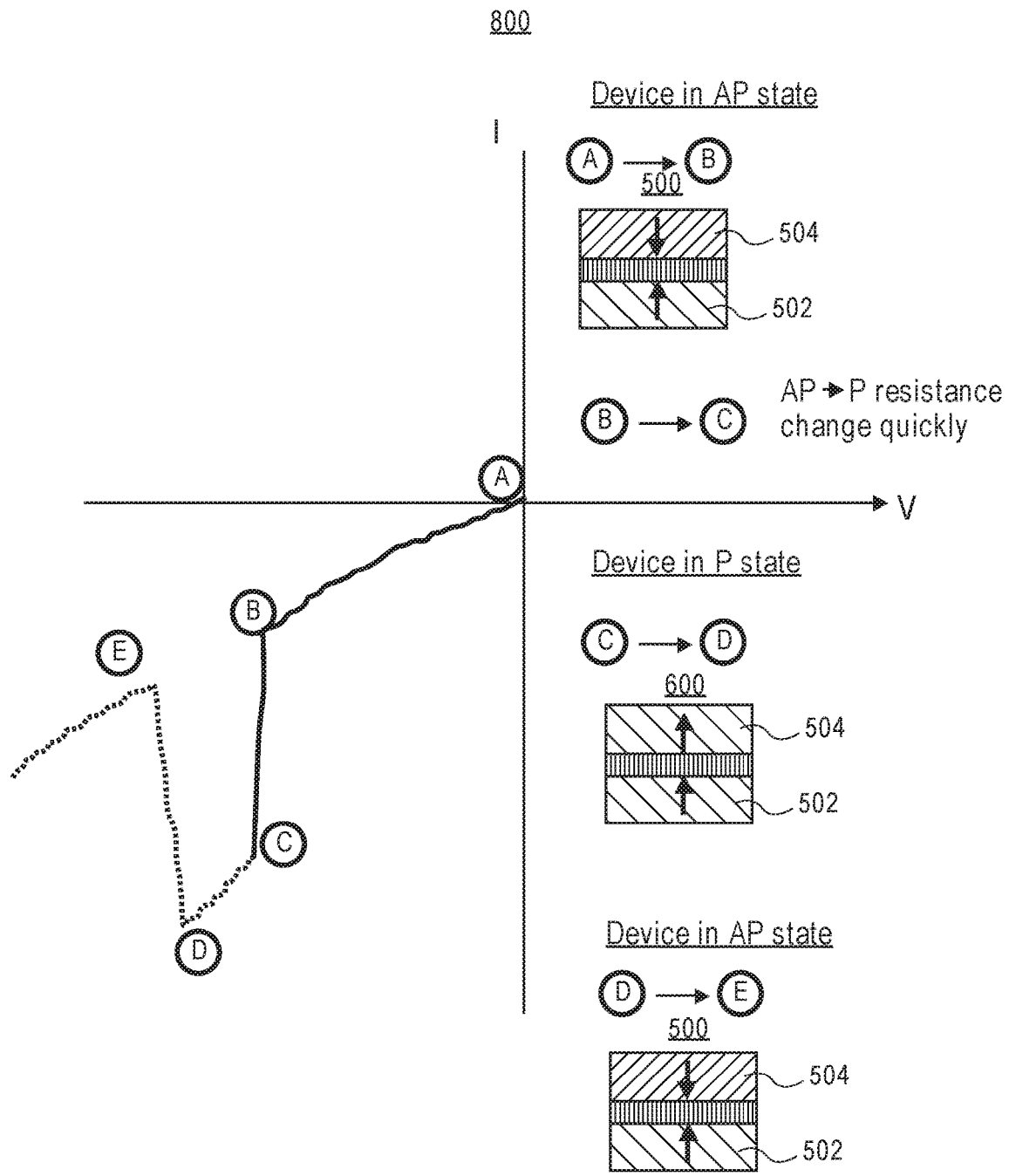
FIG. 8 is a current/voltage (IV) plot demonstrating sequential events in a unipolar switching operation of a magnetic tunnel junction (MTJ) memory element, in accordance with an embodiment of the present invention.

FIG. 8 is a current/voltage (IV) plot 800 demonstrating sequential events in a unipolar switching operation of a magnetic tunnel junction (MTJ) memory element, in accordance with an embodiment of the present invention. Referring to FIG. 8, at (A) an MTJ element (e.g., 500) begins in an anti-parallel state. From (A) to (B), an increasing negative bias is applied to the MTJ element, e.g., as applied to a free magnetic layer 504. In one embodiment, an accompanying positive bias is applied to the corresponding fixed layer 502 to increase the effective negative bias applied to the free magnetic layer 502. From (B) to (C), the MTJ quickly undergoes a resistance change from anti-parallel to parallel. At position (C), then, the MTJ is in a parallel state (e.g., MTJ element 600). From (C) to (D), the negative bias is further increased. From (D) to (E), the device then changes back to an anti-parallel state. At position (E), coercivity is recovered for stand-by mode or read operation.

Referring again to FIG. 3, in an embodiment, the free layer MTJ film or films 320 (or, alternatively, 324) is composed of a material suitable for transitioning between a majority spin and a minority spin, depending on the application. Thus, the free magnetic layer (or memory layer) may be referred to as a ferromagnetic memory layer. In one embodiment, the free magnetic layer is composed of a layer of cobalt iron (CoFe) or cobalt iron boron (CoFeB).

Referring again to FIG. 3, in an embodiment, the dielectric or tunneling layer 322 is composed of a material suitable for allowing current of a majority spin to pass through the layer, while impeding at least to some extent current of a minority spin to pass through the layer. Thus, the dielectric or tunneling layer 322 (or spin filter layer) may be referred to as a tunneling layer. In one embodiment, the dielectric layer is composed of a material such as, but not limited to, magnesium oxide (MgO) or aluminum oxide ($Al_2O_3$). In one embodiment, the dielectric layer has a thickness of approximately 1 nanometer.

Referring again to FIG. 3, in an embodiment, the fixed layer MTJ film or films 324 (or 320 in the case that 324 is a free layer) is composed of a material or stack of materials suitable for maintaining a fixed majority spin. Thus, the fixed magnetic layer (or reference layer) may be referred to as a ferromagnetic layer. In one embodiment, the fixed magnetic layer is composed of a single layer of cobalt iron boron (CoFeB). However, in another embodiment, the fixed magnetic layer is composed of a cobalt iron boron (CoFeB) layer, ruthenium (Ru) layer, cobalt iron boron (CoFeB) layer stack. In an embodiment, although not depicted, a synthetic antiferromagnet (SAF) is disposed on or adjacent the fixed layer MTJ film or films 324.

Referring again to FIG. 3, in an embodiment, the bottom electrode 318 includes a thick metal layer, such as a relatively thick titanium nitride (TiN) layer. In an embodiment, the bottom electrode 318 is a tantalum nitride (TaN) layer. In one embodiment, the bottom electrode 318 is referred to as a "thin via" layer.

Referring again to FIG. 3, in an embodiment, the top electrode 316 is composed of a material or stack of materials suitable for electrically contacting the free layer MTJ film or films 320. In an embodiment, the top electrode 316 is a topographically smooth electrode. In one such embodiment, the top electrode 316 has a thickness suitable for good conductivity but has little to no columnar structure formation that would otherwise lead to a rough top surface. Such a topographically smooth electrode may be referred to as amorphous in structure. In a specific embodiment, the top electrode 316 is composed of Ru layers interleaved with Ta layers. Effectively, in accordance with an embodiment of the present invention, the top electrode 316 may not be a conventional thick single metal electrode, such as a Ru electrode, but is instead a Ru/Ta interleaved materials stack. In alternative embodiments, however, the top electrode 316 is a conventional thick single metal electrode, such as a Ta or Ru electrode.

Referring again to FIG. 3, in an embodiment, one or more interlayer dielectrics (ILD), such as inter-layer dielectric material layer 350, are used. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Referring again to FIG. 3, in an embodiment, the conductive contacts (such as 330, 332 and 334) are composed of one or more metal or other conductive structures. A common example is the use of metal lines and structures that may or may not include barrier layers between the metal and surrounding ILD material. As used herein, the term metal includes alloys, stacks, and other combinations of multiple metals. For example, the conductive contacts may include barrier layers, stacks of different metals or alloys, etc. The conductive contacts may be coupled to interconnects such as traces, wires, lines, etc.

Referring again to FIG. 3, in an embodiment, substrate 306 is a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

It is also to be appreciated that, in certain aspects, and at least some embodiments of the present invention, certain terms hold certain definable meanings. For example, a "free" magnetic layer is a magnetic layer storing a computational variable. A "fixed" magnetic layer is a magnetic layer with fixed magnetization (magnetically harder than the free magnetic layer). A tunneling barrier, such as a tunneling dielectric or tunneling oxide, is one located between free and fixed magnetic layers. A fixed magnetic layer may be patterned to create inputs and outputs to an associated circuit. Magnetization may be written by spin hall effect. Magnetization may be read via the tunneling magneto-resistance effect while applying a voltage. In an embodiment, the role of the dielectric layer is to cause a large magneto-resistance ratio. The magneto-resistance is the ratio of the difference between resistances when the two ferromagnetic layers have anti-parallel magnetizations and the resistance of the state with the parallel magnetizations.

In an embodiment, the MTJ 314 may store a single bit of information ("0" or "1") by its state of magnetization. The information stored in the MTJ is sensed by driving a current through the MTJ. The free magnetic layer does not require power to retain its magnetic orientations. As such, the state of the MTJ is preserved when power to the device is removed. Therefore, a memory bit cell such as depicted in FIG. 3 is, in an embodiment, non-volatile.

In an embodiment, transistor 302 is a metal-oxide-semiconductor field-effect transistor (MOSFET or simply MOS transistor), fabricated on the substrate 306. In various implementations of the invention, the MOS transistor may be a planar transistor, a nonplanar transistor, or a combination of both. Nonplanar transistors include FinFET transistors such as double-gate transistors and tri-gate transistors, and wrap-around or all-around gate transistors such as nanoribbon and nanowire transistors.

In an embodiment, each MOS transistor 302 includes a gate stack formed of at least two layers, a gate dielectric layer and a gate electrode layer. The gate dielectric layer may include one layer or a stack of layers. The one or more layers may include silicon oxide, silicon dioxide (SiO$_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer of each MOS transistor 302 is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers 352 may be formed on opposing sides of the gate stack that bracket the gate stack, as is depicted in FIG. 3. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions 310 are formed within the active portion 304 of the substrate 306 and adjacent to the gate stack of each MOS transistor, as is depicted in FIG. 3. The source and drain regions 310 are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

Figure 9:
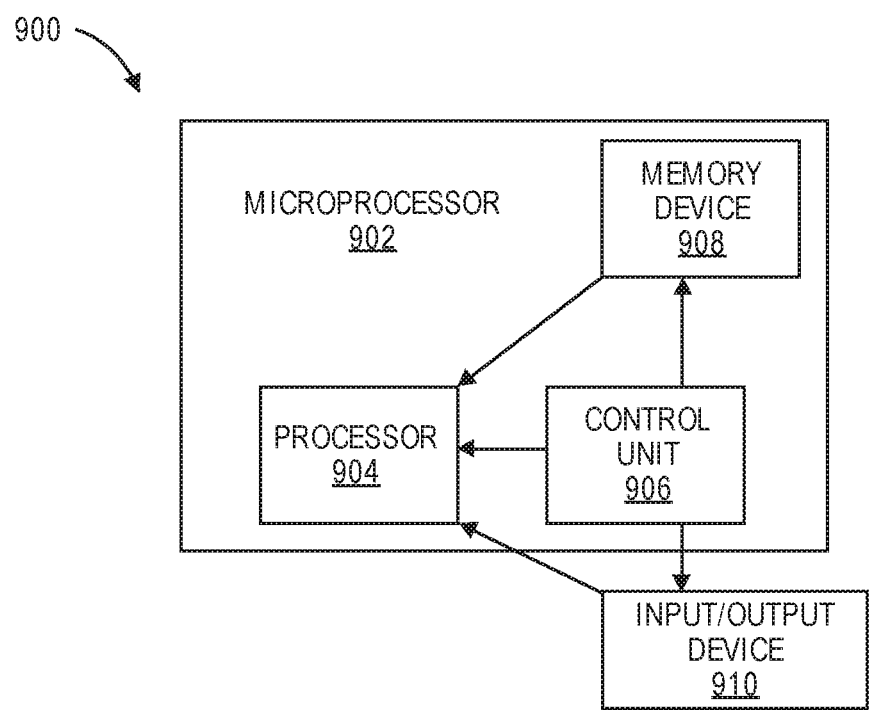
FIG. 9 illustrates a block diagram of an electronic system, in accordance with an embodiment of the present invention.

FIG. 9 illustrates a block diagram of an electronic system 900, in accordance with an embodiment of the present invention. The electronic system 900 can correspond to, for example, a portable system, a computer system, a process control system, or any other system that utilizes a processor and an associated memory. The electronic system 900 may include a microprocessor 902 (having a processor 904 and control unit 906), a memory device 908, and an input/output device 910 (it is to be understood that the electronic system 900 may have a plurality of processors, control units, memory device units and/or input/output devices in various embodiments). In one embodiment, the electronic system 900 has a set of instructions that define operations which are to be performed on data by the processor 904, as well as, other transactions between the processor 904, the memory device 908, and the input/output device 910. The control unit 906 coordinates the operations of the processor 904, the memory device 908 and the input/output device 910 by cycling through a set of operations that cause instructions to be retrieved from the memory device 908 and executed. In an embodiment, the memory device 908 can include STT-MRAM memory arrays integrated into a logic processor. In an embodiment, the memory device 908 is embedded in the microprocessor 902, as depicted in FIG. 9.

Figure 10:
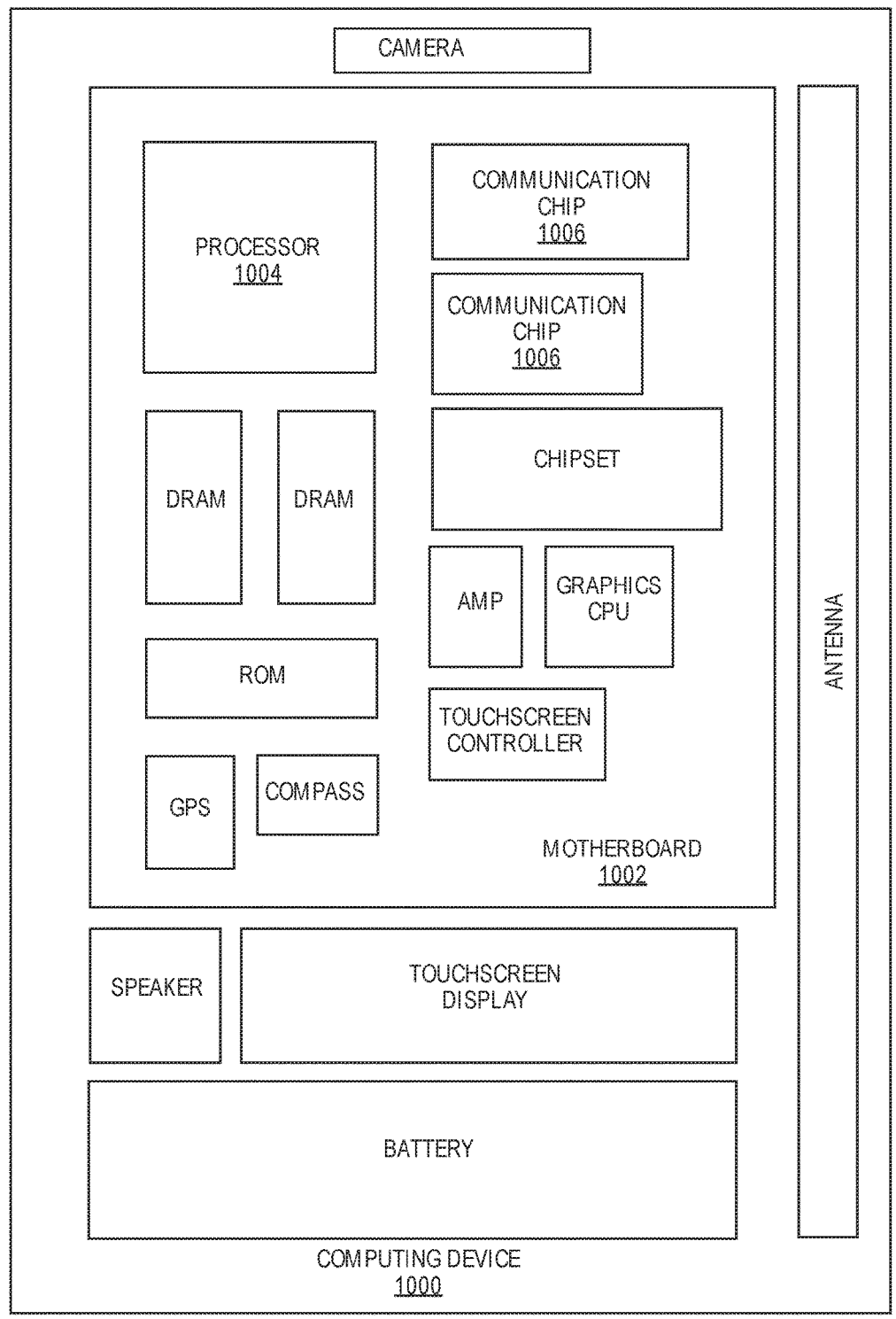
FIG. 10 illustrates a computing device in accordance with one embodiment of the invention.

FIG. 10 illustrates a computing device 1000 in accordance with one embodiment of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of embodiments of the invention, the integrated circuit die of the processor includes one or more arrays, such as arrays of unipolar switching pMTJ devices integrated into a logic processor. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of an embodiment of the invention, the integrated circuit die of the communication chip includes arrays of unipolar switching pMTJ devices integrated into a logic processor.

In further implementations, another component housed within the computing device 1000 may contain a stand-alone integrated circuit memory die that includes one or more arrays, such as arrays of unipolar switching pMTJ devices integrated into a logic processor.

In various implementations, the computing device 1000 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Accordingly, one or more embodiments of the present invention relate generally to the fabrication of embedded microelectronic memory. The microelectronic memory may be non-volatile, wherein the memory can retain stored information even when not powered. One or more embodiments of the present invention relate to the fabrication of arrays of unipolar switching pMTJ devices integrated into a logic processor. Such arrays may be used in an embedded non-volatile memory, either for its non-volatility, or as a replacement for embedded dynamic random access memory (eDRAM). For example, such an array may be used for 1T-1X memory or 2T-1X memory (X=capacitor or resistor) at competitive cell sizes within a given technology node.

Figure 11:
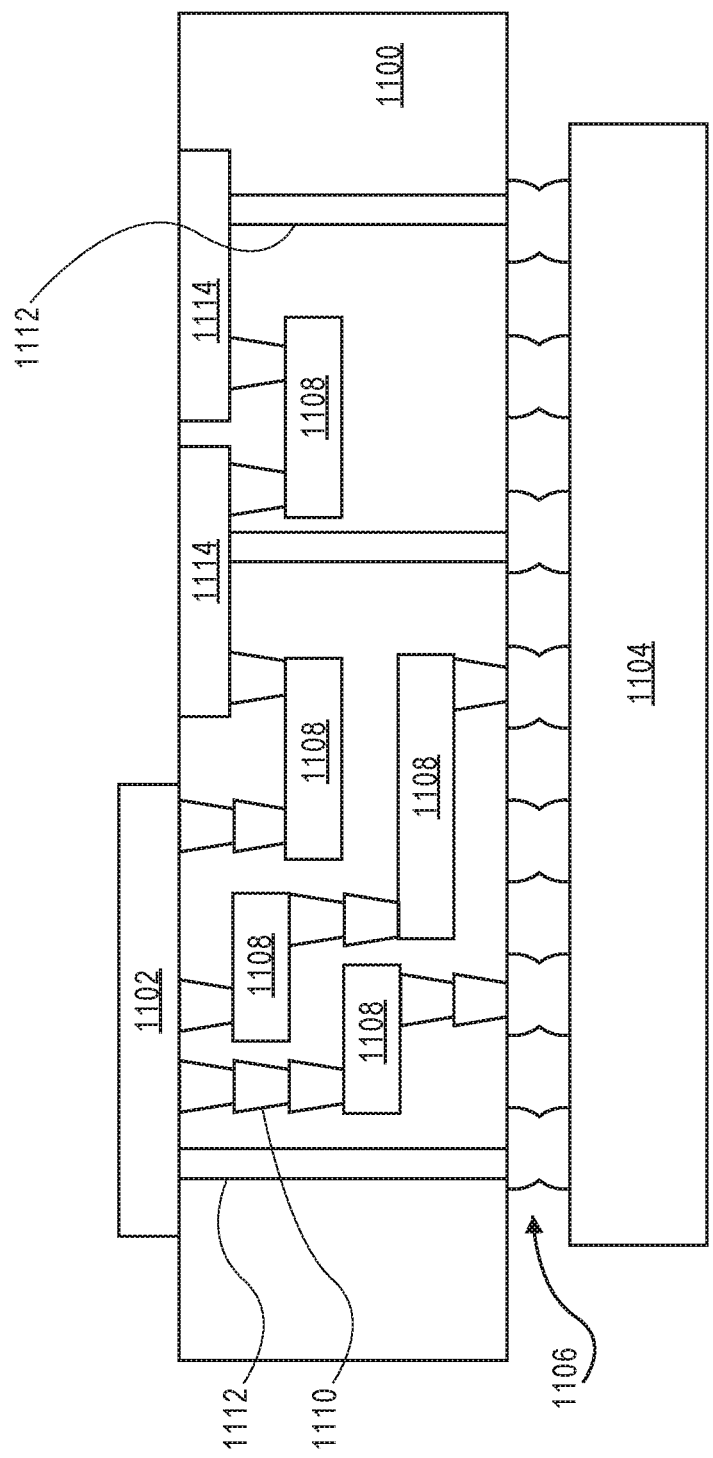
FIG. 11 illustrates an interposer that includes one or more embodiments of the invention.

FIG. 11 illustrates an interposer 1100 that includes one or more embodiments of the invention. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the invention, apparatuses or processes disclosed herein may be used in the fabrication of interposer 1100.

Thus, embodiments of the present invention include approaches and structures for unipolar current switching in perpendicular magnetic tunnel junction (pMTJ) devices through reduced bipolar coercivity.

In an embodiment, a memory array includes a plurality of bitlines and a plurality of select lines. The memory array also includes a plurality of memory elements located among and coupled to the plurality of bitlines and the plurality of select lines. Each of the plurality of memory elements includes a unipolar switching magnetic tunnel junction (MTJ) device and a select device.

In one embodiment, the select device is a transistor.

In one embodiment, only a drain region and not a source region of the transistor is coupled to the unipolar switching MTJ device.

In one embodiment, a free magnetic layer of the MTJ device is disposed distal from the drain region of the transistor, and a fixed magnetic layer of the MTJ device is disposed proximate to the drain region of the transistor.

In one embodiment, the select device is a diode.

In one embodiment, the diode is a unipolar PN junction diode.

In one embodiment, the unipolar switching MTJ device is a unipolar switching perpendicular magnetic tunnel junction (pMTJ) device.

In an embodiment, a memory element includes a unipolar switching perpendicular magnetic tunnel junction (pMTJ) device. The memory element also includes a select device coupled to the pMTJ device.

In one embodiment, the select device is a transistor.

In one embodiment, only a drain region and not a source region of the transistor is coupled to the unipolar switching pMTJ device.

In one embodiment, a free magnetic layer of the pMTJ device is disposed distal from the drain region of the transistor, and a fixed magnetic layer of the pMTJ device is disposed proximate to the drain region of the transistor.

In one embodiment, the select device is a diode.

In one embodiment, the diode is a unipolar PN junction diode.

In an embodiment, a method of performing a unipolar switching operation of a magnetic memory element includes applying an increasing negative bias to a magnetic tunnel junction (MTJ) memory element in an initial anti-parallel state. The method also includes subsequently changing a resistance of the MTJ memory element from anti-parallel to parallel. The method also includes subsequently further increasing the negative bias to the MTJ element. The method also includes subsequently changing a resistance of the MTJ memory element from parallel to anti-parallel.

In one embodiment, applying the increasing negative bias to the MTJ memory element in the initial anti-parallel state includes applying an increasing negative bias to a free magnetic layer of the MTJ memory element.

In one embodiment, applying the increasing negative bias to the free magnetic layer of the MTJ memory element further includes applying a positive bias to a fixed magnetic layer of the MTJ memory element.

In one embodiment, changing a resistance of the MTJ memory element from parallel to anti-parallel includes recovering coercivity of the MTJ element.

In one embodiment, the method further includes, subsequent to recovering coercivity of the MTJ element, leaving the MTJ element in a stand-by mode.

In one embodiment, the method further includes, subsequent to recovering coercivity of the MTJ element, performing a read operation of the MTJ element.

In one embodiment, applying the increasing negative bias to the MTJ memory element in the initial anti-parallel state includes driving with a drain region and not a source region of a select transistor coupled to the MTJ element.

In one embodiment, applying the increasing negative bias to the MTJ memory element in the initial anti-parallel state includes driving with a unipolar PN junction diode of a select diode coupled to the MTJ element.

What is claimed is:

1. A memory array, comprising: a plurality of bitlines; a plurality of select lines; and
 a plurality of memory elements located among and coupled to the plurality of bitlines and the plurality of select lines, each of the plurality of memory elements comprising a unipolar switching magnetic tunnel junction (MTJ) device and a select device, wherein the select device is a transistor, and wherein only a drain region and not a source region of the transistor is coupled to the unipolar switching MTJ device.

2. The memory element of claim 1, wherein a free magnetic layer of the MTJ device is disposed distal from the drain region of the transistor, and a fixed magnetic layer of the MTJ device is disposed proximate to the drain region of the transistor.

3. The memory array of claim 1, wherein the unipolar switching MTJ device is a unipolar switching perpendicular magnetic tunnel junction (pMTJ) device.

4. A memory element, comprising:
 a unipolar switching perpendicular magnetic tunnel junction (pMTJ) device; and a select device coupled to the pMTJ device, wherein the select device is a transistor, and wherein only a drain region and not a source region of the transistor is coupled to the unipolar switching pMTJ device.

5. The memory element of claim 4, wherein a free magnetic layer of the pMTJ device is disposed distal from the drain region of the transistor, and a fixed magnetic layer of the pMTJ device is disposed proximate to the drain region of the transistor.

6. A method of performing a unipolar switching operation of a magnetic memory element, the method comprising:
 applying an increasing negative bias to a magnetic tunnel junction (MTJ) memory element in an initial anti-parallel state; and, subsequently, changing a resistance of the MTJ memory element from anti-parallel to parallel; and, subsequently, further increasing the negative bias to the MTJ element; and, subsequently, changing the resistance of the MTJ memory element from parallel to anti-parallel, wherein applying the increasing negative bias to the MTJ memory element in the initial anti-parallel state comprises driving with a drain region and not a source region of a select transistor coupled to the MTJ element.

7. The method of claim 6, wherein applying the increasing negative bias to the MTJ memory element in the initial anti-parallel state comprises applying an increasing negative bias to a free magnetic layer of the MTJ memory element.

8. The method of claim 7, wherein applying the increasing negative bias to the free magnetic layer of the MTJ memory element further comprises applying a positive bias to a fixed magnetic layer of the MTJ memory element.

9. The method of claim 6, wherein changing a resistance of the MTJ memory element from parallel to anti-parallel comprises recovering coercivity of the MTJ element.

10. The method of claim 9, further comprising:
  subsequent to recovering coercivity of the MTJ element, leaving the MTJ element in a stand-by mode.

11. The method of claim 9, further comprising:
  subsequent to recovering coercivity of the MTJ element, performing a read operation of the MTJ element.

* * * * *